United States Patent
Nakajima et al.

(10) Patent No.: US 9,153,456 B2
(45) Date of Patent: Oct. 6, 2015

(54) PATTERN FORMING METHOD USING BLOCK COPOLYMERS

(71) Applicant: Kabushiki Kaisha Toshiba, Minato-ku (JP)

(72) Inventors: Yumi Nakajima, Yokkaichi (JP); Kentaro Matsunaga, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 22 days.

(21) Appl. No.: 14/100,549

(22) Filed: Dec. 9, 2013

(65) Prior Publication Data

US 2014/0377956 A1 Dec. 25, 2014

(30) Foreign Application Priority Data

Jun. 19, 2013 (JP) .................. 2013-128902

(51) Int. Cl.
*H01L 21/311* (2006.01)
*H01L 21/308* (2006.01)
*C03C 15/00* (2006.01)
*C03C 25/68* (2006.01)
*C23F 1/00* (2006.01)

(52) U.S. Cl.
CPC ........ *H01L 21/3086* (2013.01); *H01L 21/3085* (2013.01)

(58) Field of Classification Search
None
See application file for complete search history.

(56) References Cited

U.S. PATENT DOCUMENTS 7,964,107 B2  6/2011  Millward 8,747,682 B2 *  6/2014  Matsunaga et al. ............. 216/49
2007/0289943 A1  12/2007  Lu et al.
2008/0311347 A1  12/2008  Millward et al.
2011/0034029 A1  2/2011  Matsunaga et al.
2011/0186544 A1  8/2011  Endou et al.
2011/0240596 A1  10/2011  Millward (Continued)

FOREIGN PATENT DOCUMENTS

JP  2010-115832  5/2010
JP  2010-522643  7/2010

(Continued)

OTHER PUBLICATIONS

Naoko Kihara, "Directed Self-Assembly Lithography Technology", Toshiba Review, vol. 67, No. 4, 2012, 6 pages (with partial English translation).

(Continued)

*Primary Examiner* — Michael Jung
(74) *Attorney, Agent, or Firm* — Oblon, McClelland, Maier & Neustadt, L.L.P.

(57) ABSTRACT

According to one embodiment, first, on a process object, a hydrophilic guide pattern including a first hole forming pattern having a first hole diameter and a second hole forming pattern having a second hole diameter is formed. Then, above the guide pattern, a frame pattern having a first opening region in a forming region of a plurality of the first hole forming patterns and a second opening region in a forming region of a plurality of the second hole forming patterns is formed. Then, a first solution including a first block copolymer having a hydrophilic polymer chain and a hydrophobic polymer chain is supplied to the first opening region to condense the first block copolymer. The hydrophilic polymer chain is then removed to reduce the diameter of the first hole forming pattern to a third hole diameter that is smaller than the first hole diameter.

20 Claims, 9 Drawing Sheets

(56) References Cited

U.S. PATENT DOCUMENTS

| | | |
|---|---|---|
| 2011/0312185 A1 | 12/2011 | Seino |
| 2012/0058435 A1 | 3/2012 | Seino et al. |
| 2012/0067843 A1 | 3/2012 | Watanabe et al. |
| 2012/0127454 A1 | 5/2012 | Nakamura et al. |
| 2013/0133825 A1 | 5/2013 | Hattori et al. |
| 2014/0242799 A1* | 8/2014 | Takakuwa et al. ............ 438/702 |

FOREIGN PATENT DOCUMENTS

| | | |
|---|---|---|
| JP | 2011-35233 | 2/2011 |
| JP | 2012-4434 | 1/2012 |
| JP | 2012-33534 | 2/2012 |
| JP | 2012-59802 | 3/2012 |
| JP | 2012-64783 | 3/2012 |
| JP | 2012-108369 | 6/2012 |
| WO | WO 2008/097736 A3 | 8/2008 |

OTHER PUBLICATIONS

Joy Y. Cheng, et al., "Simple and Versatile Methods to Integrate Directed Self-Assembly with Optical Lithography Using a Polarity-Switched Photoresist", ACS Nano, vol. 4, No. 8, 2010, 9 pages.

* cited by examiner

PATTERN FORMING METHOD USING BLOCK COPOLYMERS

CROSS-REFERENCE TO RELATED APPLICATIONS

This application is based upon and claims the benefit of priority from Japanese Patent Application No. 2013-128902, filed on Jun. 19, 2013; the entire contents of which are incorporated herein by reference.

FIELD

Embodiments described herein relate generally to a pattern forming method.

BACKGROUND

In recent years, there has been proposed a method of forming a fine pattern in the semiconductor device by utilizing a phenomenon that a material is phase-separated in a self-organizing manner and a particular regular alignment pattern is formed. For example, it has been known that a first recess with a first width is formed in a first region, a second recess with a second width that is wider than the first width is formed in a second region, block copolymers that are different in number average molecular weight are supplied to the first recess and the second recess to be phase-separated such that multiple phases are aligned in a line manner. Then, a particular phase is selectively removed out of those phase-separated and the process object is etched using the remaining phase as a mask to form two types of line-and-space pattern having different widths in the first region and the second region.

In supplying the block copolymers to the first recess and the second recess, the block copolymers are supplied in the form of a solution in which the block copolymers are dissolved in a predetermined solvent. Therefore, the solution supplied in the first recess and the second recess directly diffuses into the entire first recess and second recess.

By the way, in general in semiconductor devices, contact holes (the via holes) are connected to the line-and-space pattern wiring formed as described above. However, there has been no proposal of the technique for forming the contact holes that are different in radius in accordance with multiple types of the line-and-space patterns that are different in width.

DETAILED DESCRIPTION

Figure 1A:
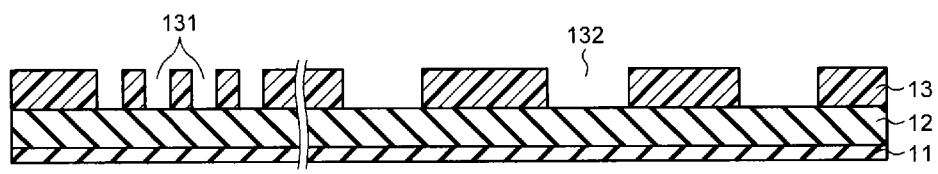
FIGS. 1A to 1G are cross-sectional views schematically illustrating an example of a procedure of a pattern forming method according to a first embodiment.

In general, according to one embodiment, first, on a process object, a hydrophilic guide pattern that includes a first hole pattern having a first hole diameter and a second hole pattern having a second hole diameter that is larger than the first hole diameter is formed. On the guide pattern, a frame pattern that has a first opening pattern in a forming region of a plurality of the first hole patterns that are disposed neighboring to each other and a second opening pattern in a forming region of a plurality of the second hole patterns that are disposed neighboring to each other is then formed. Then, a first solution including a first block copolymer having a hydrophilic polymer chain and a hydrophobic polymer chain is supplied in the first opening pattern. The first block copolymer is then condensed so that the hydrophobic polymer chain comes into contact with the guide pattern in the first solution and the hydrophilic polymer chain condenses around the center of the first hole pattern. Then, the hydrophilic polymer chain condensed around the center of the first hole pattern is removed to reduce the diameter of the first hole pattern to a third hole diameter that is smaller than the first hole diameter. Finally, the process object is processed by an etching using the guide pattern as a mask to which the hydrophobic polymer chain is attached.

By referring to the attached drawings, a pattern forming method according to the embodiments will be described below in detail. It is noted that the present invention is not limited to these embodiments. Further, the cross-sectional views used in the following embodiments are schematic views, and therefore the relationship between the thickness and the width of the layer and the ratio of the thicknesses of respective layers may be different from the actual implementation. Furthermore, the film thicknesses illustrated below are mere examples and thus the film thicknesses are not limited to them.

First Embodiment

FIGS. 1A to 1G are cross-sectional views schematically illustrating an example of a procedure of a pattern forming method according to a first embodiment, and FIGS. 2A to 2G are top views schematically illustrating the example of the procedure of the pattern forming method according to the first embodiment.

First, a hard mask layer 11 and a hard mask layer 12 are formed in this order above a process object such as a not-shown substrate, for example, an insulating film where contact holes are formed. An example of the process object may be the substrate above which memory cells such as NAND flash memory or ReRAM (Resistive Random Access Memory), for example, or peripheral circuit elements such as field effect transistors for driving the memory cells are formed and the interlayer insulating film is formed thereon. As the hard mask layers 11 and 12, a silicon oxide film or a silicon nitride film can be used. Then, a guide film is formed on the hard mask layer 12. As the guide film, the thermal-crosslink organic film such as the application type carbon film can be used. This guide film is then processed to form a guide pattern 13.

Figure 2A:
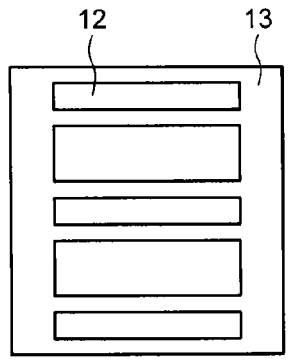
FIGS. 2A to 2G are top views schematically illustrating the example of the procedure of the pattern forming method according to the first embodiment.
Figure 2D:
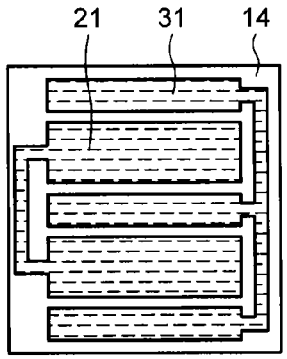

Specifically, a not-shown SOG (Spin On Glass) film and a resist film are formed in this order on the guide film. Then, a pattern exposure is made to the resist film by an ArF liquid immersion exposure apparatus to form a resist pattern for forming the holes (the contact holes). This resist pattern has a pattern of the holes to be connected to line-and-space wirings (the word lines or the bit lines) that are connected to the memory cell in the memory cell portion, and a pattern of the holes to be connected to wirings that have widths of line and space wider than those of the memory cell portion in the peripheral circuit portion, for example. Afterward, by using a dry etching apparatus, a pattern transfer is made on the SOG film using the resist pattern as the mask and then a transfer is made on the guide film using the pattern formed on the SOG film as the mask, and the guide pattern 13 is formed (FIG. 1A, FIG. 2A).

In the region corresponding to the memory cell portion of the guide pattern 13, a hole forming pattern 131 is formed, and in the region corresponding to the peripheral circuit, a hole forming pattern 132 is formed. The size of the hole forming pattern 131 is smaller than that of the hole forming pattern 132. Further, the hole forming patterns 131 and 132 are formed larger by a predetermined size than the hole to be finally formed. The diameter of the hole forming pattern 131 is 60 nm, for example, and the diameter of the hole forming pattern 132 is 200 nm, for example.

Figure 1B:
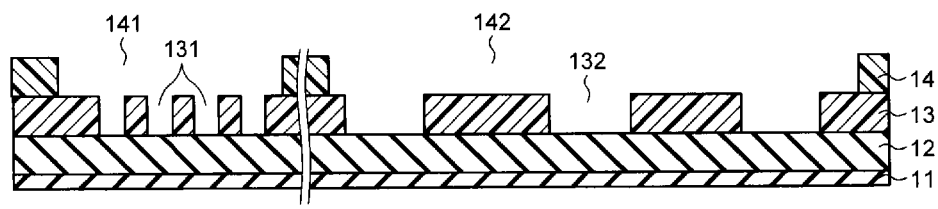
Figure 1C:
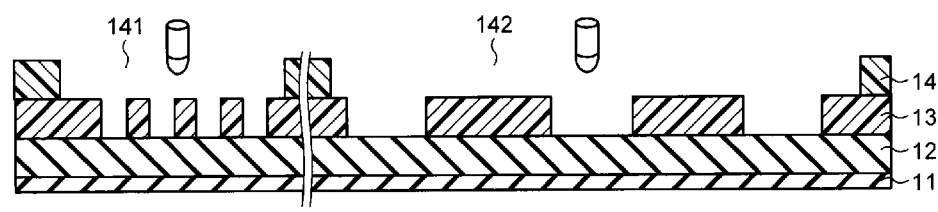
Figure 1D:
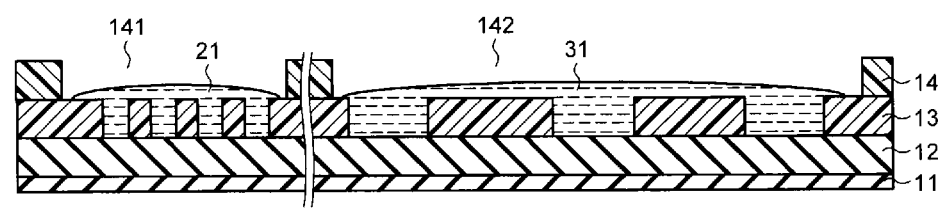

Then, a resist is applied on the hard mask layer 12 above which the guide pattern 13 is formed, and a resist film is formed by a baking. A pattern exposure is then made by the ArF liquid immersion exposure apparatus to form the resist pattern for arranging a frame pattern. This resist pattern is formed so as to define the memory cell portion and the peripheral circuit portion. After the exposure, the baking is made and the development process is made, and therefore a frame pattern 14 is formed on the guide pattern 13 (FIG. 1B, FIG. 2B). The frame pattern 14 has an opening region 141 provided in the region where the hole forming pattern 131 is formed in the memory cell portion and an opening region 142 provided in the region where the hole forming pattern 132 is formed in the peripheral circuit portion. Further, as illustrated in FIG. 2B, the frame pattern 14 may have a connection region 143 connecting the opening regions 141 to each other that define the memory cell portion and a connection region 144 connecting the opening regions 142 to each other that define the peripheral circuit portion.

Then, by the process such as an ink-jet method, a first solution 21 in which a first block copolymer is dissolved is dropped into the opening region 141 and a second solution 31 in which a second block copolymer is dissolved is dropped into the opening region 142 (FIGS. 1C to 1D, FIGS. 2C to 2D). At this time, the frame pattern 14 serves to accommodate the dropped first solution 21 in the region (the opening region 141) in which the hole forming pattern 131 is formed and accommodate the dropped second solution 31 in the region (the opening region 142) in which the hole forming pattern 132 is formed. Further, as illustrated in FIG. 2B, when a plurality of opening regions 141 are connected by the connection region 143, the drop of the first solution 21 into one opening region 141 causes the first solution 21 to be supplied also to other opening regions 141 via the connection region 143. The same applies to the second solution 31.

Here, the block copolymer has a structure in which multiple types of polymer chains are coupled. Each polymer chain has a single type of monomer chain structure. The first block copolymer and the second block copolymer used in the first embodiment have a structure in which a (hydrophilic) polymer chain of high affinity with the guide pattern 13 and a (hydrophobic) polymer chain of low affinity with the guide pattern 13 are coupled. As the first block copolymer and the second block copolymer, polystyrene-polymethylmethacrylate (hereafter, referred to as Ps-b-PMMA) different in molecular weight can be used. For the first block copolymer and the second block copolymer, the molecular weights and the compositions of the block copolymers to be used are determined based on the diameters (the sizes of the holes) of the hole forming patterns 131 and 132 formed in the guide pattern 13 and the diameters of the holes (the sizes of the holes) to be finally formed in the process object. For example, the Ps-b-PMMA of the molecular weight of 18,000 can be used for the first block copolymer and the Ps-b-PMMA of the molecular weight of 50,000 can be used for the second block copolymer. In this case, the first block copolymer and the second block copolymer are different in composition ratio of the polystyrene (Ps) and the polymethylmethacrylate (PMMA).

Figure 1E:
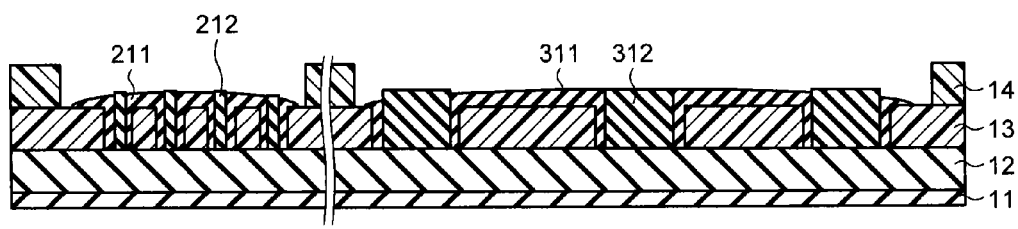

The process object is then baked, for example, at 240 degrees centigrade for 60 seconds by a hotplate in a nitrogen atmosphere. This causes the same type of polymer chains in the block copolymer in the solution to be condensed to form a block (phase) made of the same type of polymer chains. In this example, the guide pattern 13 functions as a physical guide, so that hydrophobic polymer chains 211 and 311 are condensed in the guide pattern 13 side. That is, the hydrophobic polymer chains (Ps) 211 and 311 are condensed in the side wall side of the hole forming patterns 131 and 132 of the guide pattern 13 and hydrophilic polymer chains (PMMA) 212 and 312 are condensed around the center of the hole forming patterns 131 and 132, resulting in self-alignment (FIG. 1E, FIG. 2E).

Figure 1F:
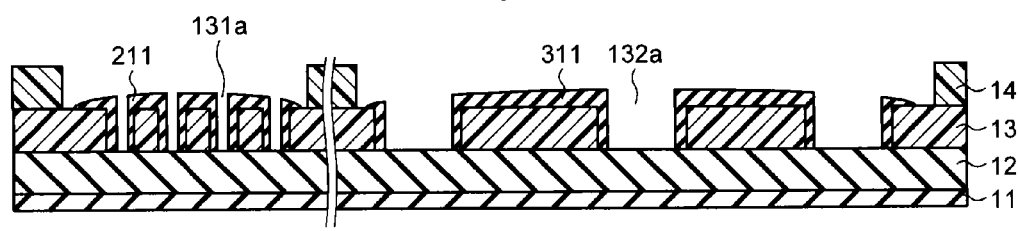
Figure 2F:
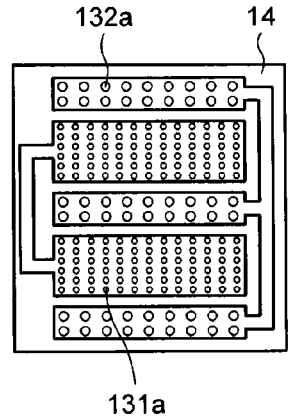
Figure 2B:
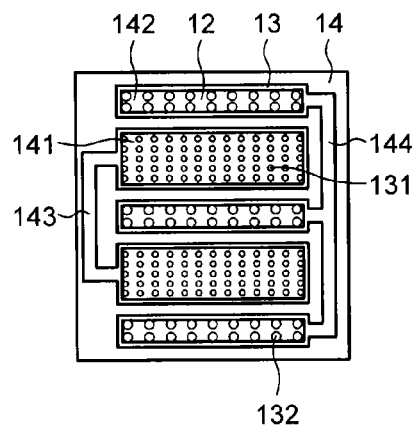
Figure 2E:
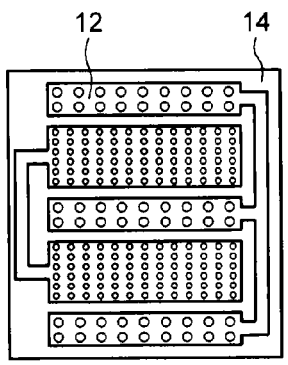

Subsequently, out of the condensed polymer chains, the hydrophilic polymer chains 212 and 312 condensed around the center of the hole forming patterns 131 and 132 are selectively removed (FIG. 1F, FIG. 2F). For example, some parts of the hydrophilic polymer chains (PMMA) 212 and 312 are decomposed by the irradiation of the light of 172 nm to the substrate using an $Xe_2$ excimer lamp. Subsequently, an organic solvent such as developing solution or alcohol is discharged to the substrate to form a liquid filling state on the process object. The organic solvent is then drained and removed and thus the decomposed object of the hydrophilic polymer chain (PMMA) is removed. This causes the hydrophobic polymer chain to attach to the side walls of the hole forming patterns 131 and 132 formed in the guide pattern 13 and the hole forming patterns 131a and 132a whose diameters have been reduced are formed. When the above-described materials are used for the first block copolymer and the second block copolymer, the diameter of the hole forming pattern 131a in the memory cell portion is 20 nm and the diameter of the hole forming pattern 132a in the peripheral circuit portion is 190 nm.

Figure 1G:
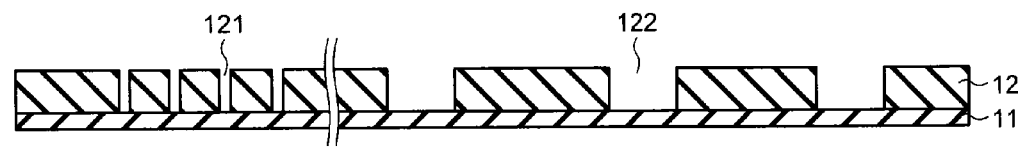
Figure 2G:
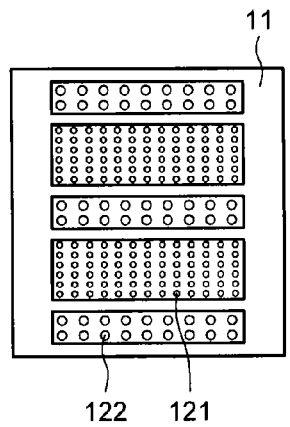
Figure 2C:
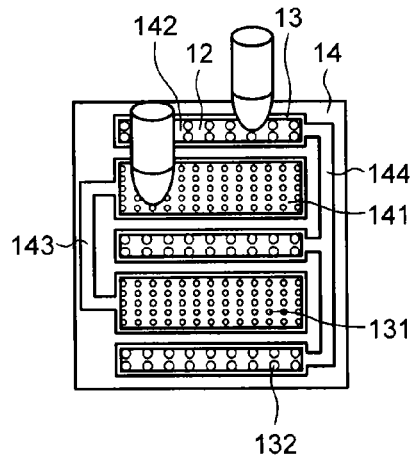

Then, the hard mask layer 12 is etched by, for example, a dry etching using the guide pattern 13 covered with the hydrophobic polymer chains 211 and 311 as a mask. Thereby, a hole forming pattern 121 is formed in the memory cell portion of the hard mask layer 12, and a hole forming pattern 122 is formed in the peripheral circuit portion (FIG. 1G, FIG. 2G).

Furthermore, although not depicted, the hard mask layer 11 is patterned by, for example, a dry etching using the hard mask layer 12 as a mask in which the hole forming patterns 121 and 122 are formed. The not-shown process object is etched by, for example, a dry etching using the patterned hard mask layer 11 as a mask. For example, the hole (the via hole) reaching the wiring is formed by an etching in the insulating film formed on the line-and-space pattern wiring. As set forth, the pattern forming process is completed.

In the first embodiment, the plural types of the hole forming patterns 131 and 132 having the different diameters are formed in the guide pattern 13, the frame pattern 14 that defines the hole forming patterns 131 and 132 for each type is formed on the guide pattern 13, the solution in which the block copolymers of the different molecular weight or composition is supplied to each region within the frame pattern 14, and the block copolymer is condensed to reduce the diameters of the hole forming patterns 131a and 132a formed in the guide pattern 13. This allows the desired size of the holes or the via holes to be formed in the process object all at once by using the guide pattern 13.

That is, the frame pattern 14 is provided so as to define the regions such as the memory cell portion, the peripheral circuit portion, and the like in which the diameters of the hole patterns are intended to be different, so that respective regions can be supplied with the different types of the block copolymers. Therefore, it is no longer necessary to pattern the holes for respective regions, so that the holes can be patterned all at once. As a result, the number of processes can be reduced compared to the case where respective regions are patterned, resulting in the advantage of the reduction in the manufacturing cost of the semiconductor device.

Further, it allows for the advantage of being able to form the hole having a smaller diameter than the hole diameter which can be formed by the photolithography.

Second Embodiment

FIGS. 3A to 3G are cross-sectional views schematically illustrating an example of a procedure of a pattern forming method according to a second embodiment.

Figure 3A:
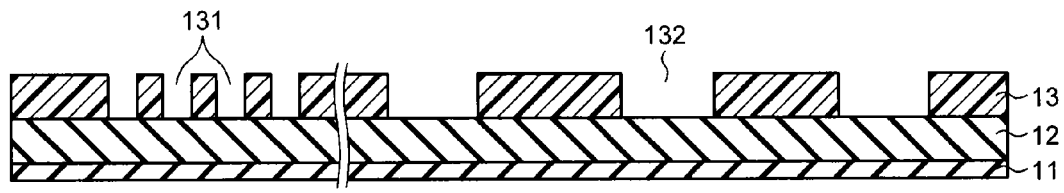
FIGS. 3A to 3G are cross-sectional views schematically illustrating an example of a procedure of a pattern forming method according to a second embodiment.

First, a hard mask layer 11 and a hard mask layer 12 are formed in this order above the process object such as a not-shown substrate, for example, an insulating film where the contact holes are formed. As the hard mask layers 11 and 12, a silicon oxide film or a silicon nitride film can be used. On the hard mask layer 12, a not-shown anti-reflection film is applied, and a resist film is formed thereon. A pattern exposure is then made to the resist film by the ArF liquid immersion exposure apparatus to form a guide pattern 13 (FIG. 3A).

In the region corresponding to the memory cell portion of the guide pattern 13 a hole forming pattern 131 is formed, and in the region corresponding to the peripheral circuit a hole forming pattern 132 is formed. The size of the hole forming pattern 131 is smaller than that of the hole forming pattern 132. Further, the hole forming pattern 131 is formed larger by a predetermined size than the hole to be finally formed. The diameter of the hole forming pattern 131 is 60 nm, for example, and the diameter of the hole forming pattern 132 is 200 nm, for example.

Figure 3B:
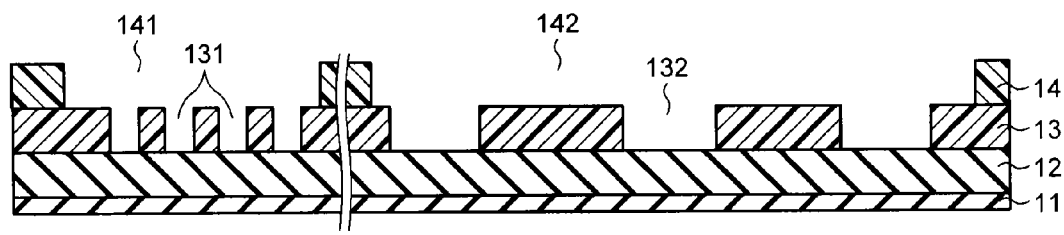

Then, a resist is applied on the hard mask layer 12 on which the guide pattern 13 is formed, and a resist film is formed by a baking. A pattern exposure is then made by the ArF liquid immersion exposure apparatus to form the resist pattern for arranging a frame pattern. This resist pattern is formed so as to define the memory cell portion and the peripheral circuit portion. After the exposure, a baking is made and a development process is made, and therefore a frame pattern 14 is formed on the guide pattern 13 (FIG. 3B). The frame pattern 14 has an opening region 141 provided in the region in the memory cell portion where the hole forming pattern 131 is formed and an opening region 142 provided in the region in the peripheral circuit portion where the hole forming pattern 132 is formed. Further, similarly to FIG. 2B of the first embodiment, the frame pattern 14 may have a connection region 143 connecting the opening regions 141 to each other that define the memory cell portion and a connection region 144 connecting the opening regions 142 to each other that define the peripheral circuit portion.

Figure 3C:
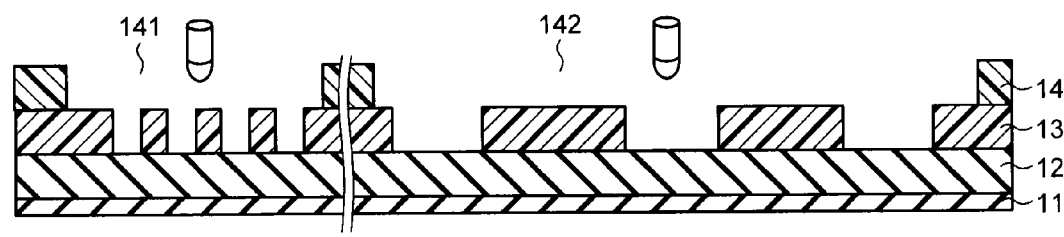
Figure 3D:
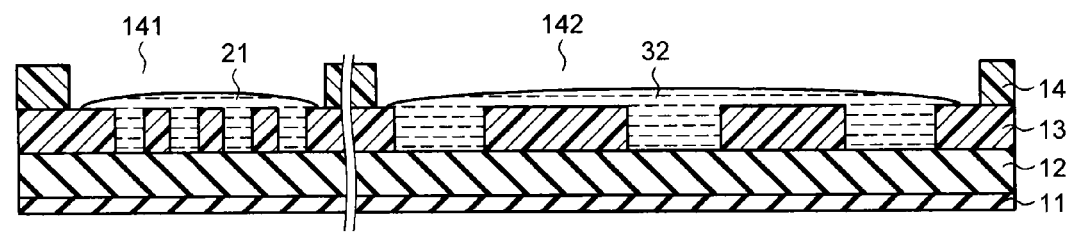

Then, by the process such as an ink-jet method, a first solution 21 in which a first block copolymer is dissolved is dropped into the opening region 141 and a second solution 32 in which a PMMA resin is dissolved is dropped into the opening region 142 (FIGS. 3C to 3D). At this time, the frame pattern 14 serves to accommodate the dropped first solution 21 in the region (the opening region 141) in which the hole forming pattern 131 is formed and accommodate the dropped second solution 32 in the region (the opening region 142) in which the hole forming pattern 132 is formed. Further, as illustrated in FIG. 2B, when a plurality of opening regions 141 are connected by the connection region 143, the drop of the first solution 21 into one opening region 141 causes the first solution 21 to be supplied also to other opening regions 141 via the connection region 143. The same applies to the second solution 32.

The first block copolymer has a structure in which a (hydrophilic) polymer chain of high affinity with the guide pattern 13 and a (hydrophobic) polymer chain of low affinity with the guide pattern 13 are coupled. For the first block copolymer, the molecular weight and the composition of the block copolymer to be used are determined based on the diameter (the size of the hole) of the hole forming pattern 131 formed in the guide pattern 13 and the diameter of the hole (the size of the hole) to be finally formed in the process object. For example, the Ps-b-PMMA of the molecular weight of 18,000 can be used for the first block copolymer.

Figure 3E:
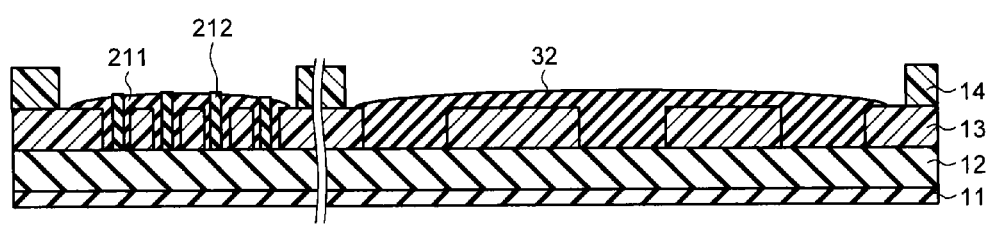

The process object is then baked, for example, at 240 degrees centigrade for 60 seconds by a hotplate in a nitrogen atmosphere. This causes the same type of polymer chains in the block copolymer in the solution to be condensed to form a block (phase) made of the same type of polymer chains. In this example, the guide pattern 13 functions as a physical guide, so that a hydrophobic polymer chain 211 is condensed in the guide pattern 13 side. That is, the hydrophobic polymer chain (Ps) 211 is condensed in the side wall side of the hole forming pattern 131 of the guide pattern 13 and a hydrophilic polymer chain (PMMA) 212 is condensed around the center of the hole forming pattern 131, resulting in self-alignment (FIG. 3E). It is noted that, in the hole forming pattern 132, since the block copolymer is not dissolved in the second solution 32, there is no self-alignment. In this example, the PMMA resin is solidified.

Figure 3F:
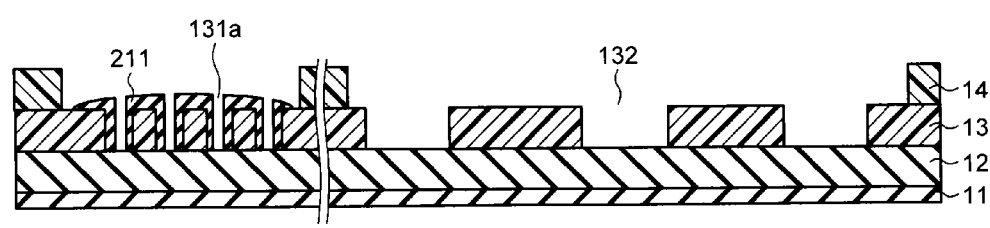

Subsequently, out of the condensed polymer chains, the hydrophilic polymer chain 212 condensed around the center of the hole forming pattern 131 is selectively removed and the solidified PMMA resin in the hole forming patterns 132 is removed (FIG. 3F). For example, the hydrophilic polymer chain (PMMA) 212 and the solidified PMMA resin are decomposed by the irradiation of the light of 172 nm to the substrate using an $Xe_2$ excimer lamp. Subsequently, an organic solvent such as developing solution or alcohol is discharged to the substrate to form a liquid filling state on the process object. The organic solvent is then drained and removed and thus the decomposed objects of the hydrophilic polymer chain (PMMA) and the PMMA resin are removed. This results in a hole forming pattern 131a that has been reduced in diameter from the hole forming pattern 131 formed in the guide pattern 13. It is noted that, since the hydrophobic polymer chain does not attach to the hole forming pattern 132, there is no change in the diameter. When the above-described material is used for the first block copolymer, the diameter of the hole forming pattern 131a in the memory cell portion is 20 nm and the diameter of the hole forming pattern 132 in the peripheral circuit portion is 200 nm.

Figure 3G:
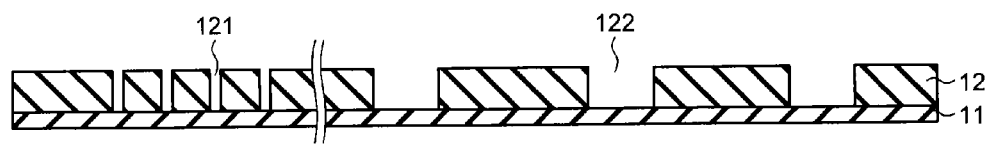

Then, the hard mask layer 12 is etched by, for example, a dry etching using the guide pattern 13 covered with the hydrophobic polymer chain 211 as a mask. Thereby, a hole forming pattern 121 is formed in the memory cell portion of the hard mask layer 12, and a hole forming pattern 122 is formed in the peripheral circuit portion (FIG. 3G).

Furthermore, although not depicted, the hard mask layer 11 is patterned by, for example, a dry etching using the hard mask layer 12 as a mask in which the hole forming patterns 121 and 122 are formed. The process object is etched by a dry etching using the patterned hard mask layer 11 as a mask. For example, the hole (the via hole) reaching the wiring is formed by an etching in the insulating film formed on the line-and-space pattern wiring. As set forth, the pattern forming process is completed.

In the second embodiment, the solution in which the block copolymer is dissolved is dropped into the hole forming pattern 131 of the guide pattern 13, and the solution in which the hydrophilic polymer is dissolved is dropped into the hole forming pattern 132. In addition to the advantages of the first embodiment, this allows for the advantage that the hole diameter of the targeted region only can be reduced.

Third Embodiment

In the second embodiment, the case has been described where the second solution 32 having the PMMA resin dissolved therein is supplied to the hole forming pattern 132. After the solidification of the second solution 32, however, the PMMA resin in the hole forming pattern 132 is removed. Thus, in a third embodiment, described will be the case where the second solution 32 is not supplied into the hole forming pattern 132.

Figure 4A:
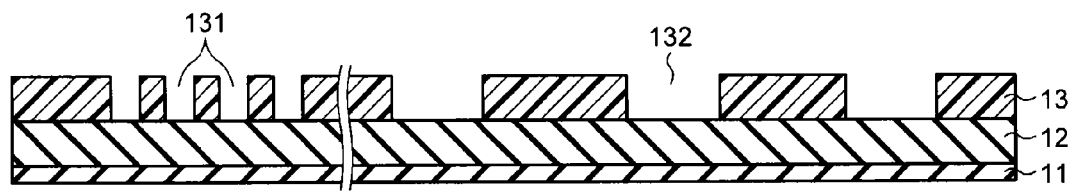
FIGS. 4A to 4G are cross-sectional views schematically illustrating an example of a procedure of a pattern forming method according to a third embodiment.
Figure 4B:
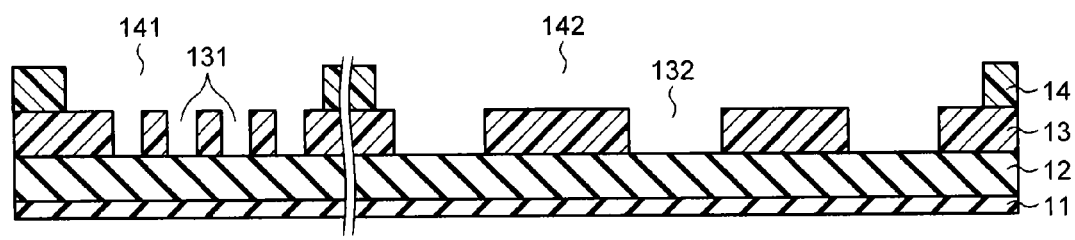

FIGS. 4A to 4G are cross-sectional views schematically illustrating an example of a procedure of a pattern forming method according to the third embodiment. Similarly to the cases of the first and the second embodiments, hard mask layers 11 and 12 are formed in this order on a not-shown process object and then a guide pattern 13 is formed that has a hole forming pattern 131 in the region corresponding to the memory cell portion on the hard mask layer 12 and has a hole forming pattern 132 in the region corresponding to the peripheral circuit portion (FIG. 4A). Furthermore, on the guide pattern 13, a frame pattern 14 is formed that has an opening region 141 provided in the forming region of the hole forming pattern 131 in the memory cell portion and an opening region 142 provided in the forming region of the hole forming pattern 132 in the peripheral circuit portion (FIG. 4B).

Figure 4C:
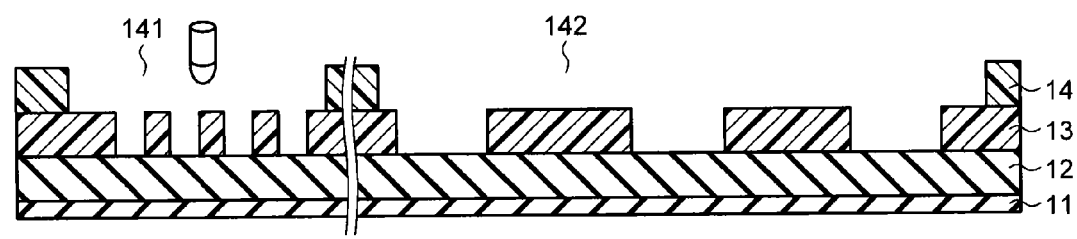
Figure 4D:
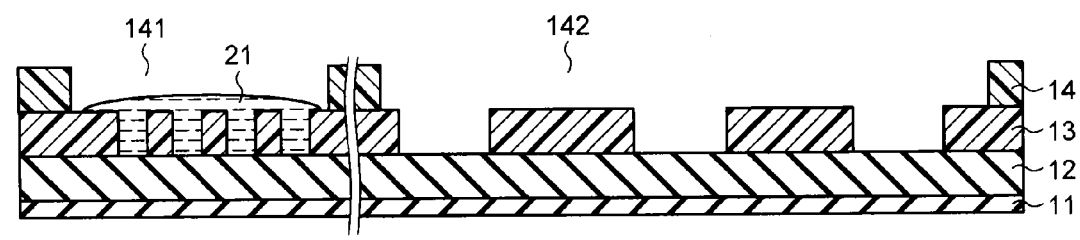

Then, by the process such as an ink-jet method, a first solution 21 in which a first block copolymer is dissolved is dropped into the opening region 141, but nothing is dropped into the opening region 142 (FIGS. 4C to 4D). At this time, the frame pattern 14 serves to accommodate the dropped first solution 21 in the region (the opening region 141) in which the hole forming pattern 131 is formed. Further, as illustrated in FIG. 2B, when a plurality of opening regions 141 are connected by a connection region 143, the drop of the first solution 21 into one opening region 141 causes the first solution 21 to be supplied also to other opening regions 141 via the connection region 143. The first block copolymer used here is the same as that described in the first and the second embodiments.

Figure 4E:
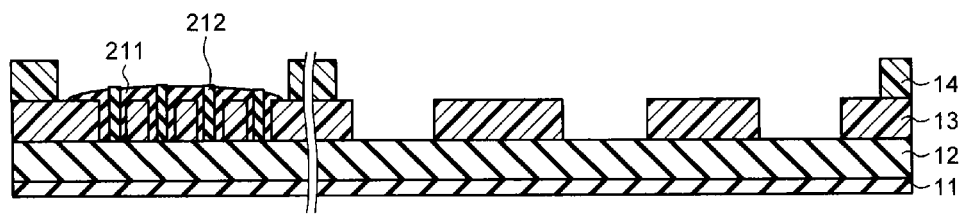

The process object is then baked, for example, at 240 degrees centigrade for 60 seconds by a hotplate in a nitrogen atmosphere. This causes the same type of polymer chains in the block copolymer in the solution to be condensed to form a block (phase) made of the same type of polymer chain. In this example, the guide pattern 13 functions as a physical guide, so that a hydrophobic polymer chain 211 is condensed in the guide pattern 13 side. That is, the hydrophobic polymer chain (Ps) 211 is condensed in the side wall side of the hole forming pattern 131 of the guide pattern 13 and a hydrophilic polymer chain (PMMA) 212 is condensed around the center of the hole forming pattern 131, resulting in self-alignment (FIG. 4E).

Figure 4F:
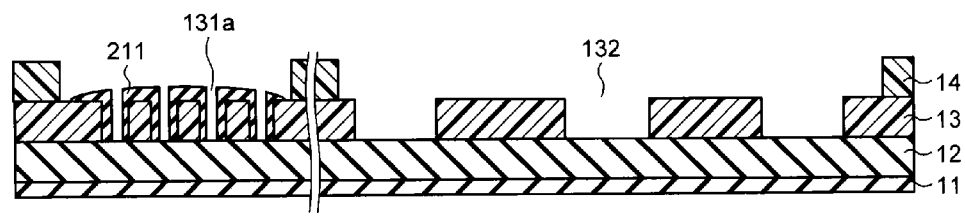

Subsequently, out of the condensed polymer chains, the hydrophilic polymer chain 212 condensed around the center of the hole forming patterns 131 is selectively removed (FIG. 4F). For example, some parts of the hydrophilic polymer chain (PMMA) 212 is decomposed by the irradiation of the light of 172 nm to the substrate using an $Xe_2$ excimer lamp. Subsequently, an organic solvent such as developing solution or alcohol is discharged to the process object to form a liquid filling state on the process object. The organic solvent is then drained and removed and thus the decomposed objects of the hydrophilic polymer chain (PMMA) 212 are removed. This results in a hole forming pattern 131a that has been reduced in diameter from the hole forming pattern 131 formed in the guide pattern 13. It is noted that, since no process is applied to the hole forming pattern 132, there is no change in the state. When the above-described material is used for the first block copolymer, the diameter of the hole forming pattern 131a in the memory cell portion is 20 nm and the diameter of the hole forming pattern 132 in the peripheral circuit portion is 200 nm.

Figure 4G:
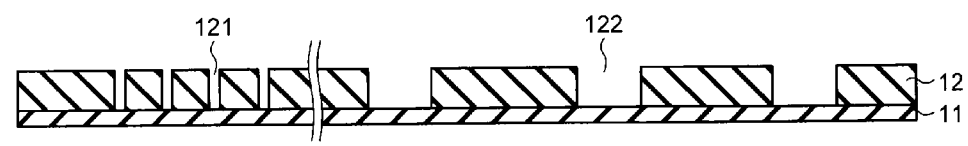

Then, the hard mask layer 12 is etched by, for example, a dry etching using the guide pattern 13 covered with the hydrophobic polymer chain 211 as a mask. Thereby, a hole forming pattern 121 is formed in the memory cell portion of the hard mask layer 12, and a hole forming pattern 122 is formed in the peripheral circuit portion (FIG. 4G). Further, the hard mask layer 12 is used to process the hard mask layer 11 and the not-shown process object, so that the desired holes (the via holes) can be formed in the process object. As set forth, the pattern forming process is completed.

In the third embodiment, the solution having the block copolymer or the hydrophilic polymer dissolved is not supplied to the region where no change is intended in the hole diameter. This allows for the advantage that, in addition to the advantages of the second embodiment, the material used for forming the holes can be reduced compared to the second embodiment.

Fourth Embodiment

FIGS. 5A to 5F are top views schematically illustrating an example of a procedure of a pattern forming method according to a fourth embodiment, and FIGS. 6A to 6F are cross-sectional views along A-A of FIGS. 5A to 5F. It is noted that, in FIGS. 5A to 5F, the left-right direction in the figure is defined as the X direction, and the direction orthogonal to the X direction within the drawing sheet is defined as the Y direction.

Figure 5A:
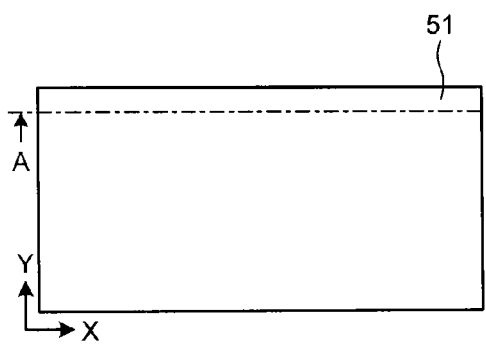
FIGS. 5A to 5F are top views schematically illustrating an example of a procedure of a pattern forming method according to a fourth embodiment.
Figure 5B:
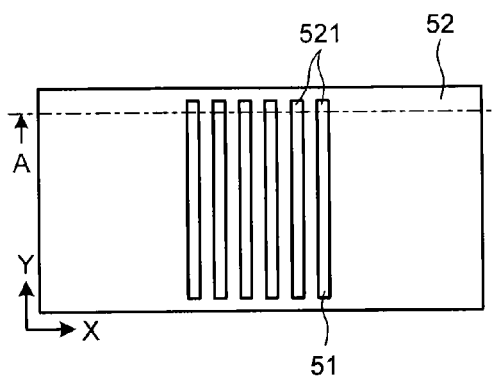
Figure 6A:
FIGS. 6A to 6F are cross-sectional views along A-A of FIGS. 5A to 5F.
Figure 6B:
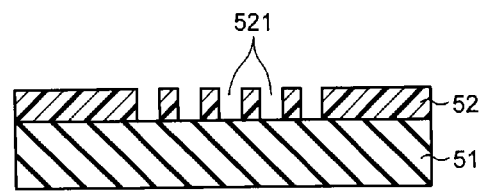

First, a process object 51 is prepared (FIG. 5A, FIG. 6A). The process object 51 is an object to be hole-formed such as an insulating film. Above the process object 51, a negative resist 52 is applied. Then, a line-and-space trench pattern 521 extending in the Y direction is formed by a photolithography technique (FIG. 5B, FIG. 6B). The width in the X direction of the trench pattern may be larger than the size of the hole diameter to be finally formed in the memory cell portion.

Figure 5C:
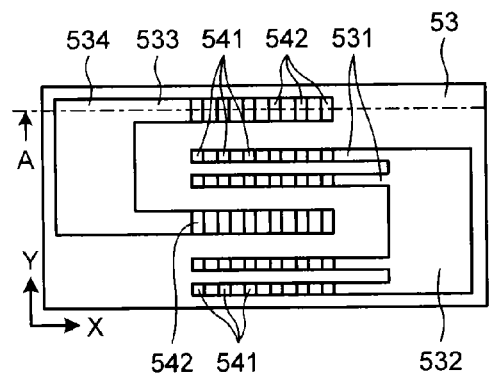
Figure 6C:
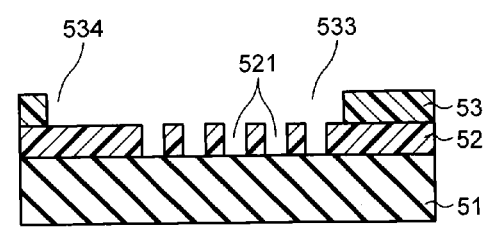

Then, on the negative resist 52 in which the trench pattern 521 is formed, a positive resist 53 is applied. Then, by a photolithography technique, formed are plural types of trench patterns 531 and 533 intersecting the trench pattern 521 and extending in the X direction, which are different in width, and solution drop regions 532 and 534 connected to the trench patterns 531 and 533 (FIG. 5C, FIG. 6C). The trench pattern 531 may have substantially the same width as the trench pattern 521 and be larger than the size of the hole diameter to be finally formed in the memory cell portion. Further, the trench pattern 533 may have a wider width than the trench pattern 521 and be larger than the size of the hole diameter to be finally formed in the peripheral circuit portion.

The intersection position of the trench pattern 521 and the trench pattern 531 is the hole forming position in the memory cell portion, and a substantially square hole forming pattern 541 is formed. The hole forming pattern 541 is configured by the side walls, which are defined by the negative resist 52 extending in the Y direction, and the side walls, which are defined by the positive resist 53 extending in the X direction. Further, the solution drop region 532 is provided so as to be connected to the trench pattern 531.

The intersection position of the trench pattern 521 and the trench pattern 533 is the hole forming position in the peripheral circuit portion, and a rectangular hole forming pattern 542 whose longitudinal direction is the Y direction is formed. The hole forming pattern 542 is configured by the side walls, which are defined by the negative resist 52 extending in the Y direction, and the side walls, which are defined by the positive resist 53 extending in the X direction. Further, the solution drop region 534 is provided so as to be connected to the trench pattern 533.

Here, the trench pattern 521 formed by the negative resist 52 and a part of the trench patterns 531 and 533 formed at the same height as the negative resist 52 formed by the positive resist 53 configure a guide pattern (physical guide) defining the condensation position of the block copolymer. Further, the trench patterns 531 and 533 and the solution drop regions 532 and 534 formed by the positive resist 53 at the region above the negative resist 52 configure a frame pattern.

Figure 5D:
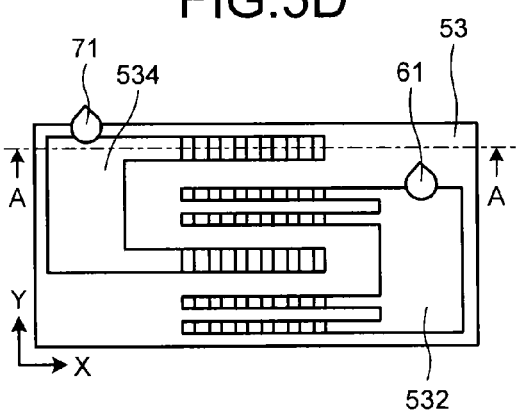
Figure 6D:
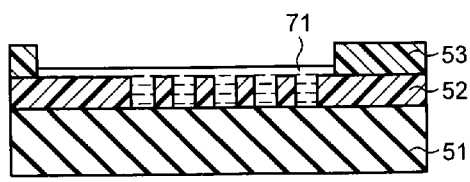

Then, by the process such as an ink-jet method, a first solution 61 in which a first block copolymer is dissolved is dropped into the solution drop region 532, and a second solution 71 in which a second block copolymer is dissolved is dropped into the solution drop region 534 (FIG. 5D, FIG. 6D). The first solution 61 dropped into the solution drop region 532 is supplied to each trench pattern 531 by a capillary phenomenon. Similarly, the second solution 71 dropped into the solution drop region 534 is supplied to each trench pattern 533 by a capillary phenomenon. Here, the solution drop regions 532 and 534 are equal to or larger than the discharge port of the inkjet head.

Similarly to the first embodiment, the first block copolymer and the second block copolymer have the structure in which a (hydrophilic) polymer chain of high affinity with the negative resist 52 and the positive resist 53 and a (hydrophobic) polymer chain of low affinity with the negative resist 52 and the positive resist 53 are coupled. For the first block copolymer and the second block copolymer, the Ps-b-PMMAs that are different in molecular weight can be used. For the first block copolymer and the second block copolymer, the molecular weights and the compositions of the block copolymers to be used are determined based on the diameters (the sizes of the holes) of the hole forming patterns 541 and 542 and the diameters of the holes (the sizes of the holes) to be finally formed in the process object 51. For example, the Ps-b-PMMA of the molecular weight of 18,000 can be used for the first block copolymer and the Ps-b-PMMA of the molecular weight of 50,000 can be used for the second block copolymer.

Figure 5E:
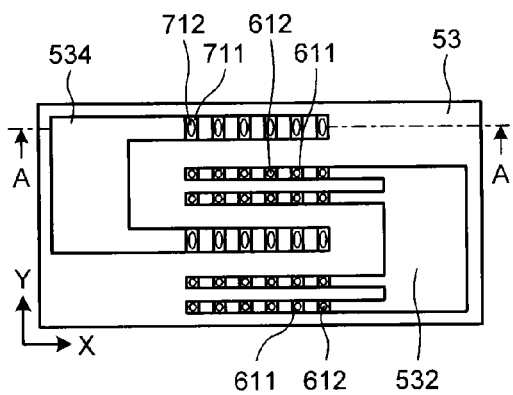
Figure 6E:
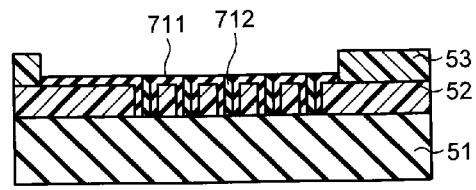

Then, some appropriate heat treatment or process in the solvent atmosphere is provided resulting in that the same type of polymer chains in the block copolymer in the solution is condensed and a block (phase) made of the same type of polymer chain is formed. In this example, the negative resist 52 and the positive resist 53 function as a physical guide, so that hydrophobic polymer chains 611 and 711 are condensed in the negative resist 52 side and the positive resist 53 side. That is, the hydrophobic polymer chains 611 and 711 are condensed in the side wall side of the hole forming patterns 541 and 542 and hydrophilic polymer chains 612 and 712 are condensed around the center of the hole forming patterns 541 and 542, resulting in self-alignment (FIG. 5E, FIG. 6E).

Subsequently, out of the condensed polymer chains, the hydrophilic polymer chains 612 and 712 condensed around the center of the hole forming patterns 541 and 542 are selectively removed. For example, some parts of the hydrophilic polymer chains 612 and 712 are decomposed by the irradiation of the light of 172 nm to the substrate using an $Xe_2$ excimer lamp. Subsequently, an organic solvent such as developing solution or alcohol is discharged to the substrate to form a liquid filling state on the process object 51. The organic solvent is then drained and removed and thus the decomposed objects of the hydrophilic polymer chains 612 and 712 are removed. This causes the hydrophobic polymer chains 611 and 711 attach to the side walls of the hole forming patterns 541 and 542 and the hole forming patterns whose diameters have been reduced are formed. Further, at this time, the different block copolymers form the hole patterns having the different size and shape.

Figure 5F:
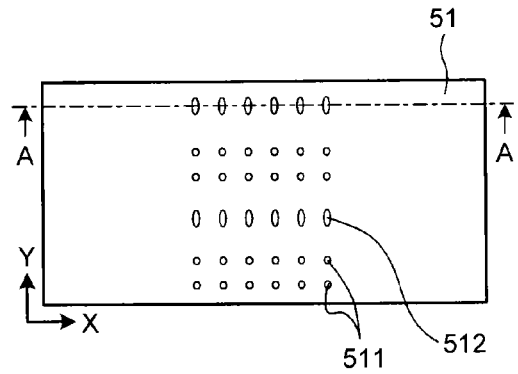
Figure 6F:
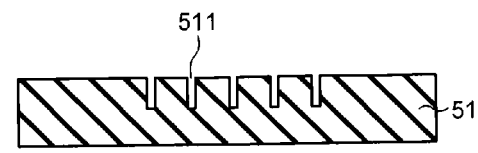

The process object 51 is then processed by a dry etching using the formed hole patterns as a mask material. Then, the negative resist 52, the positive resist 53, and the block copolymer are removed by a resist stripping process such as ashing, so that hole patterns 511 and 512 formed in the process object 51 that are different in the desired size can be obtained (FIG. 5F, FIG. 6F).

It is noted that, while the negative resist and the positive resist are used in the above description, the negative resist and the positive resist can be selected as long as the trench patterns 521, 531, and 533 and the solution drop regions 532 and 534 can be formed.

In the fourth embodiment, the line-and-space trench pattern 521 is formed on the first resist layer, the second resist layer having plural types of the line trench patterns 531 and 533 intersecting the trench pattern 521 and the solution drop regions 532 and 534 are formed on the first resist layer, the solutions in which the block copolymers are dissolved are dropped into the solution drop regions 532 and 534, and the block copolymers are condensed to form the hole patterns 511 and 512 whose diameters are smaller than the holes formed by the trench pattern 521 and the trench patterns 531 and 533. Therefore, plural sizes of fine holes can be formed within the same layer.

Further, unlike the first to third embodiments, the line trench patterns 521, 531 and 533 intersecting to each other are used to form the hole patterns 511 and 512 at the intersection position, instead of first forming the hole patterns 511 and 512 in the guide pattern. In general in the photolithography, the size of the hole pattern can be smaller than the size of the line pattern, which allows for the advantage that the hole patterns 511 and 512 having further smaller diameter than those in the cases of the first to third embodiments can be formed.

In the above embodiments, although the cases where the Ps-b-PMMA is used as the block copolymer have been exemplified, the embodiments are not limited to them. For example, the block copolymer can be used, such as Polystyrene-Poly(methyl methacrylate), Polystyrene-Poly(ethylene glycol), Polystyrene-Poly(acrylic acid), Poly(ethylene glycol)-Polylactide methyl ether, Poly(L-lactide)-Poly(ethylene glycol) methyl ether, Poly(ethylene glycol) methyl ether-Poly(lactide-co-glycolide), Poly(ethylene glycol)-Poly(ϵ-caprolactone) methyl ether, Poly(ethylene oxide)-Polycaprolactone, Polystyrene-Poly(ethylene glycol), Poly(ethylene glycol) methyl ether-Poly(D,L lactide), Polypyrrole-Poly(caprolactone). Further, when these block copolymers are used, the molecular weight may be changed and the composition ratio of each polymer chain may be changed, similarly to the case where the Ps-b-PMMA is used. Furthermore, it is not always necessary to dissolve the same type of block copolymer for the first solution and the second solution, and thus the different types of block copolymers may be dissolved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method comprising:
    forming, above a process object, a hydrophilic guide pattern including first hole patterns having a first hole diameter and second hole patterns having a second hole diameter that is larger than the first hole diameter;
    forming, on the guide pattern, a frame pattern having a first opening pattern and a second opening pattern, the first opening pattern being disposed on the guide pattern surrounding a forming region of a plurality of the first hole patterns that are disposed neighboring to each other, and the second opening pattern being disposed on the guide pattern surrounding a forming region of a plurality of the second hole patterns that are disposed neighboring to each other;
    supplying a first solution including a first block copolymer having a hydrophilic polymer chain and a hydrophobic polymer chain to the first opening pattern;
    supplying a second solution to the second opening pattern;
    condensing the first block copolymer so that the hydrophobic polymer chain comes into contact with the guide pattern and the hydrophilic polymer chain condenses around a center of each of the first hole patterns in the first solution;
    removing the hydrophilic polymer chain condensed around the center of each of the first hole pattern to reduce the diameter of each of the first hole patterns to a third hole diameter that is smaller than the first hole diameter; and
    processing the process object by an etching using the guide pattern as a mask to which the hydrophobic polymer chain is attached, wherein
    in the forming of the frame pattern, the first opening pattern and the second opening pattern are formed in a same process.

2. The pattern forming method according to claim 1, wherein in the forming the frame pattern, a connection pattern connecting a plurality of the first opening patterns to each other that are positioned apart from each other or a plurality of the second opening patterns to each other that are positioned apart from each other is formed in the frame pattern.

3. The pattern forming method according to claim 1 wherein the
    second solution includes a second block copolymer having the hydrophilic polymer chain and the hydrophobic polymer chain; and
    the method further comprising:
        condensing the second block copolymer so that the hydrophobic polymer chain comes into contact with the guide pattern and the hydrophilic polymer chain condenses around a center of each of the second hole patterns in the second solution with condensing the first block copolymer; and
    in the removing the hydrophilic polymer chain, the hydrophilic polymer chain condensed around the center of each of the second hole patterns is removed to reduce the diameter of each of the second hole patterns to a fourth hole diameter that is smaller than the second hole diameter.

4. The pattern forming method according to claim 3, wherein molecular weights or composition ratios of the hydrophilic polymer chain and the hydrophobic polymer chain are different between the first block copolymer and the second block copolymer.

5. The pattern forming method according to claim 4, wherein the first block copolymer and the second block copolymer are copolymers of polymethylmethacrylate and polystyrene.

6. The pattern forming method according to claim 1 wherein the
    second solution includes hydrophilic polymer; and
    the method further comprising:
        solidifying the hydrophilic polymer within each of the second hole patterns in the second solution with condensing the first block copolymer; and in the removing the hydrophilic polymer chain, the hydrophilic polymer solidified within each of the second hole patterns is removed.

7. The pattern forming method according to claim 6, wherein
    the first block copolymer is a copolymer of polymethylmethacrylate and polystyrene, and
    the hydrophobic polymer is polymethylmethacrylate.

8. The pattern forming method according to claim 1, wherein the guide pattern is a hydrophilic resist or a crosslink organic film.

9. The pattern forming method according to claim 1, wherein, a composition of the hydrophobic polymer chain and the hydrophilic polymer chain in the first block copolymer or a molecular weight of the first block copolymer is determined so that a gap between the first hole diameter and the third hole diameter is filled with the condensed hydrophobic polymer chain.

10. The pattern forming method according to claim 1, wherein the guide pattern is formed by a photolithography.

11. The pattern forming method according to claim 1, wherein
    the guide pattern is a pattern in which a first trench pattern extending in a first direction and having a first width is arranged in a second direction intersecting the first direction with the first width,
    the first opening pattern is a second trench pattern extending in the second direction and having a second width,
    the second opening pattern is a third trench pattern extending in the second direction and having a third width that is wider than the second width, and
    each of the first hole patterns formed in the guide pattern is formed at an intersection position of the first trench pattern and the second trench pattern, and each of the second hole patterns is formed in an intersection position of the first trench pattern and the third trench pattern.

12. The pattern forming method according to claim 11, wherein the first width is substantially the same as the second width.

13. The pattern forming method according to claim 11 wherein the
    second solution includes a second block copolymer having the hydrophilic polymer chain and the hydrophobic polymer chain; and
    the method further comprising:
        condensing the second block copolymer so that the hydrophobic polymer chain comes into contact with the guide pattern and the hydrophilic polymer chain condenses around a center of each of the second hole patterns in the second solution with condensing the first block copolymer; and
        in the removing the hydrophilic polymer chain, the hydrophilic polymer chain condensed around the center of each of the second hole patterns is removed to reduce the diameter of each of the second hole patterns to a fourth hole diameter that is smaller than the second hole diameter.

14. The pattern forming method according to claim 11, wherein
    in the forming the frame pattern, a first connection pattern connecting a plurality of the first trench patterns to each other that are positioned apart from each other and a second connection pattern connecting a plurality of the second trench patterns to each other that are positioned apart from each other are further formed in the frame pattern;
    in the supplying the first solution, the first solution is supplied to the first connection pattern; and
    in the supplying the second solution, the second solution is supplied to the second connection pattern.

15. The pattern forming method according to claim 14, wherein molecular weights or composition ratios of the hydrophilic polymer chain and the hydrophobic polymer chain are different between the first block copolymer and the second block copolymer.

16. The pattern forming method according to claim 15, wherein the first block copolymer and the second block copolymer are copolymers of polymethylmethacrylate and polystyrene.

17. The pattern forming method according to claim 14, wherein the first connection pattern and the second connection pattern have sizes that are larger than discharge ports of inkjet heads adapted to supply the first solution and the second solution.

18. The pattern forming method according to claim 11, wherein
    the guide pattern is configured by a negative resist, and
    the frame pattern is configured by a positive resist.

19. The pattern forming method according to claim 1, wherein
    each of the first hole patterns is provided corresponding to a forming position of a line-and-space wiring pattern formed in a memory cell portion, and
    each of the second hole patterns is provided to a forming position of a peripheral circuit portion.

20. The pattern forming method according to claim 1, wherein a hard mask layer is disposed between the process object and the guide pattern.

* * * * *